United States Patent
Ma et al.

(10) Patent No.: US 7,602,067 B2
(45) Date of Patent: Oct. 13, 2009

(54) HETERO-STRUCTURE VARIABLE SILICON RICH NITRIDE FOR MULTIPLE LEVEL MEMORY FLASH MEMORY DEVICE

(75) Inventors: Yi Ma, Santa Clara, CA (US); Robert Ogle, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/957,787

(22) Filed: Dec. 17, 2007

(65) Prior Publication Data

US 2009/0152617 A1   Jun. 18, 2009

(51) Int. Cl.
*H01L 29/40* (2006.01)
(52) U.S. Cl. .............. 257/760; 257/E29.309; 257/325
(58) Field of Classification Search ......... 257/321, 257/316, 640, 649, 760, 324, 325, 411, 635, 257/758, 310, 412, 382–410, 368, E29.309
See application file for complete search history.

(56) References Cited

U.S. PATENT DOCUMENTS

| | | | |
|---|---|---|---|
| 4,870,470 A * | 9/1989 | Bass et al. | 257/324 |
| 6,927,145 B1 | 8/2005 | Yang et al. | |
| 7,012,299 B2 * | 3/2006 | Mahajani et al. | 257/324 |
| 2005/0199944 A1 * | 9/2005 | Chen et al. | 257/324 |
| 2007/0082447 A1 | 4/2007 | Lu et al. | |
| 2007/0170495 A1 | 7/2007 | Mine et al. | |
| 2008/0093661 A1 * | 4/2008 | Joo et al. | 257/324 |
| 2008/0121981 A1 * | 5/2008 | Shiraiwa et al. | 257/324 |

OTHER PUBLICATIONS

International Search Report for International Application No. PCT/US2008/086913 dated Mar. 23, 2009.
Written Opinion of the International Searching Authority for International Application No. PCT/US2008/086913 dated Mar. 23, 2009.

* cited by examiner

*Primary Examiner*—Davienne Monbleau
*Assistant Examiner*—Shweta Mulcare
(74) *Attorney, Agent, or Firm*—Turocy & Watson, LLP

(57) ABSTRACT

Charge storage stacks containing hetero-structure variable silicon richness nitride for memory cells and methods for making the charge storage stacks are provided. The charge storage stack can contain a first insulating layer on a semiconductor substrate; n charge storage layers comprising silicon-rich silicon nitride on the first insulating layer, wherein numbers of the charge storage layers increase from the bottom to the top and a k-value of an n–1th charge storage layer is higher than a k-value of an nth charge storage layer; n–1 dielectric layers comprising substantially stoichiometric silicon nitride between each of the n charge storage layers; and a second insulating layer on the nth charge storage layers.

20 Claims, 7 Drawing Sheets

HETERO-STRUCTURE VARIABLE SILICON RICH NITRIDE FOR MULTIPLE LEVEL MEMORY FLASH MEMORY DEVICE

TECHNICAL FIELD

The subject innovation generally relates to charge storage stacks containing hetero-structure variable silicon richness nitride for memory cells and methods for making the charge storage stacks.

BACKGROUND

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

Conventionally, Flash memory is constructed of many Flash memory cells where a single bit is stored in each memory cell and the cells are programmed by electron injection and may be erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as multi-level storage (MLS) architecture. This structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

SUMMARY

The following presents a simplified summary of the innovation in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

One aspect of the subject innovation described herein provides charge storage stacks for method cells. The charge storage stack can contain a first insulating layer on a semiconductor substrate; n charge storage layers comprising silicon-rich silicon nitride on the first insulating layer, wherein numbers of the charge storage layers increase from the bottom to the top and a k-value of an n−1th charge storage layer is higher than a k-value of an nth charge storage layer; n−1 dielectric layers comprising substantially stoichiometric silicon nitride between each of the n charge storage layers; and a second insulating layer on the nth charge storage layers.

In another aspect of the subject innovation described herein, provides charge storage stacks a first insulating layer on a semiconductor substrate; n charge storage layers comprising silicon-rich silicon nitride on the first insulating layer, wherein numbers of the charge storage layers increase from the bottom to the top and silicon richness of an n−1th charge storage layer is higher than silicon richness of an nth charge storage layer; n−1 dielectric layers comprising substantially stoichiometric silicon nitride between each of the n charge storage layers; and a second insulating layer on the two or more charge storage layers.

Yet another aspect of the subject innovation described herein provides methods of forming charge storage stacks for memory cells. The method can involves providing a first insulating layer on a semiconductor substrate; forming n charge storage layers on the first insulating layer, wherein numbers of the charge storage layers increase from the bottom to the top and a k-value of an n−1th charge storage layer is higher than a k-value of an nth higher charge storage layer; forming n−1 dielectric layers between each of the n charge storage layers; and forming a second insulating layer on the nth charge storage layer.

The following description and the annexed drawings set forth in detail certain illustrative aspects of the claimed subject matter. These aspects are indicative, however, of but a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

DETAILED DESCRIPTION

Figure 1:
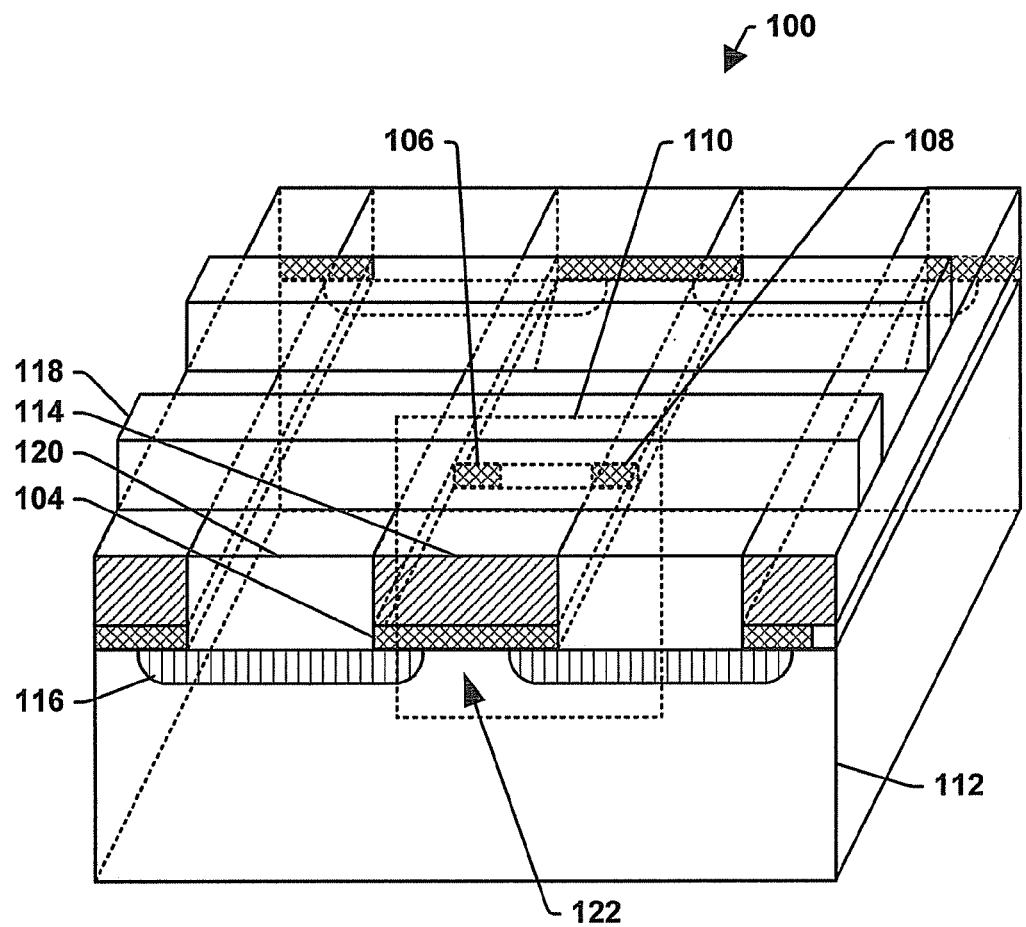
FIG. 1 is a cross-sectional isometric illustration of a portion of a flash memory device in accordance with one aspect of the specification.

The innovation described herein provides charge storage stacks, memory devices containing the charge storage stacks, and methods for making the charge storage stacks. The charge storage stack can contain multiple layers. The charge storage stack can contain two or more charge storage layers between a first insulating layer and a second insulating layer, and one or more dielectric layers between each of the two or more charge storage layers. The charge storage layer can contain silicon-rich silicon nitride. The dielectric layer can contain silicon nitride such as substantially stoichiometric silicon nitride.

Varying the silicon content of the silicon rich silicon nitride causes the energy bandgap to change, which in turn affects the degree to which or amount of electron/hole/charge trapping occurs in the resultant charge storage layer. Tuning the silicon richness of the individual silicon rich silicon nitride layers allows for modifying the properties of each individual silicon rich silicon nitride layer. Consequently, the innovation described herein provides the ability to tailor the charge storage stack a memory cell to meet the particular requirements associated with a specific end-use for the memory device.

The charge storage stack can store electrons within predetermined regions. The charge storage stack can have two or more storages nodes. When the charge storage stack has two storage nodes, a memory cell containing the charge storage stack may be referred to as dual bit memory cell or a mirror bit memory cell.

Each bit of memory cells can be programmed and/or erased to multiple levels. When voltages utilized to program memory cells are increased or sustained for longer periods of time, the number of electrons or amount of charge stored in the memory cells can be increased or otherwise varied. This allows the memory cell to be utilized for additional data storage and/or programming states. Different amounts of charge can correspond to different programmed states. This technique may be referred to as multi-level cell technology, which is useful to increase density and reduce manufacturing costs. For example, when the charge storage stack can provide two storage nodes and a four level of Vt distribution (L1, L2, L3, and L4), the charge storage stack can be programmed to multiple levels such as sixteen different combinations of charge (e.g., L1-L1, L1-L2, L1-L3, L1-L4, L2-L1, L2-L2, L2-L3, L2-L4, L3-L1, L3-L2, L3-L3, L3-L4, L4-L1, L4-L2, L4-L3, and L4-L4) providing the equivalent of four-bits-per-memory (e.g., a quad bit data storage).

The trapped electrons in the charge storage stack tend to remain generally localized due to the low conductivity of the charge storage layer and/or the low lateral electric field therein. By containing two or more charge storage layers, the multiple layer structure of the charge storage stack can provide containment of the trapped electrons horizontally and/or vertically. As a result, the charge storage stack can provide one or more of the following advantages: narrower Vt distribution for multiple level memory cell (e.g., Flash memory cell), easier control of the multiple levels to which the memory cell is programmed and/or erased, reduced disturbance to neighboring bits and/or cells, and enhanced data retention.

Although the charge storage stack can be applied to any type of memory device, the innovation is hereinafter illustrated and described in the context of an exemplary semiconductor device having one or more memory arrays containing dual bit memory-cells arranged in a virtual ground type array architecture. The dual bit memory cell typically includes the charge storage stack on a semiconductor substrate with implanted conductive bitlines. Wordlines are formed over the charge trapping dielectric layer substantially perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement. The details of the structure and manufacture of the dual bit flash memory device are not critical to the practice of the subject innovation.

The details of the structure and manufacture of the dual bit flash memory device can be found in, for example, commonly-assigned U.S. Pat. No. 7,176,113, issued Feb. 13, 2007, which is hereby incorporated by reference.

The claimed subject matter is now described with reference to the drawings, wherein like reference numerals are used to refer to like elements throughout. In the following description, for purposes of explanation, numerous specific details are set forth in order to provide a thorough understanding of the subject innovation. It may be evident, however, that the claimed subject matter may be practiced without these specific details. In other instances, well-known structures and devices are shown in block diagram form in order to facilitate describing the subject innovation.

FIG. 1 is a cross-sectional isometric illustration of a portion of a flash memory device 100. The flash memory devise can contain a memory cell 102 as indicated by a dashed line. The memory cell 102 can include a charge storage stack 104 containing a first location 106 and a second location 108. The first location 106 and the second location 108 provide regions for storing an electrical charge, such as electrons. For illustrative purposes, the memory cell is shown as a dual cell memory with two locations for storing electrical charges, although it is understood that any number of locations maybe provided, as well.

The memory cell 102 can contain the charge storage stack 104 over a semiconductor substrate 112. The charge storage stack 104 can contain a hetero-structure variable silicon richness nitride. The memory cell 102 can further contain a first poly 114 on the charge storage stack 104, a pair of bit lines 116 in the semiconductor substrate 112 adjacent the charge storage stack 104 and under a bit line dielectric 116; and a word line 118. The memory cell 102 can be separated from adjacent memory cells by the bit line dielectric 120 such as oxides (e.g., silicon oxide, high temperature oxide (HTO), high density plasma (HDP) oxide).

The charge storage stack 104 can provide locations (e.g., two charge storage nodes 106, 108) between bit lines 116 for storage of electrical charges. Since the memory cell 102 has the two charge storage nodes 106, 108 in the charge storage stack 104, the memory cell 102 can store two physically distinct bits. Each bit within the memory cell 102 serves as a binary unit of data (e.g., either 1 or 0) that can be mapped directly to a memory array. Reading or programming one side of charge storage nodes 106, 108 can occur independently of whatever data is stored on the opposite side of the charge storage nodes 106, 108.

In one embodiment, the two charge storage nodes 106, 108 are not physically separated in a charge storage stack 104. In another embodiment, the two charge storage nodes 106, 108 are physically separated from each other by a central dielectric (not shown) in the charge storage stack 104. Locations 106 and 108 indicate generally where respective bits of data can be stored in a memory cell 102. It will be appreciated that the channel 122 has an effective length and that the bits will be brought closer together as this length is reduced (e.g., as a result of scaling).

The charge storage stack 104 provides a storage medium for storing electrons (not shown). As will be described in detail below, the charge storage stack 104 can contain a first insulating layer, at least two charge storage layers on the first insulating layer, at least one dielectric layer between the charge storage layers, and a second insulating layer on the charge storage layers (not shown). The charge storage layer can provide two or more charge-storing locations for storing the electrons in a single instance of the memory cell. The first insulating layer, the dielectric layers between each of the charge storage layers, and/or the second insulating layer can provide containment of the electrons. The electrons provide a substantial change in the threshold voltage for the memory cell system 100 allowing for detection of the stored electrons.

Two conductive bit lines 116 are depicted in FIG. 1 underlying the charge storage stack 104. It will be appreciated that any number of such bit lines can be implanted into the semiconductor substrate 112. The bit lines 116 typically contain an implanted n-type material, such as arsenic, and may include an oxide portion (not shown) in some examples. The two conductive bit lines 116 are spaced apart and define a channel region 122 therebetween.

Two conductive word lines 118 are similarly depicted overlying the charge storage stack 104. It will be appreciated that any number of such word lines can be formed over the charge storage stack 104. The word lines 118 can contain a polysilicon material, for example, where the polysilicon material may be deposited over the charge storage stack 104 and then patterned and etched.

Figure 2A:
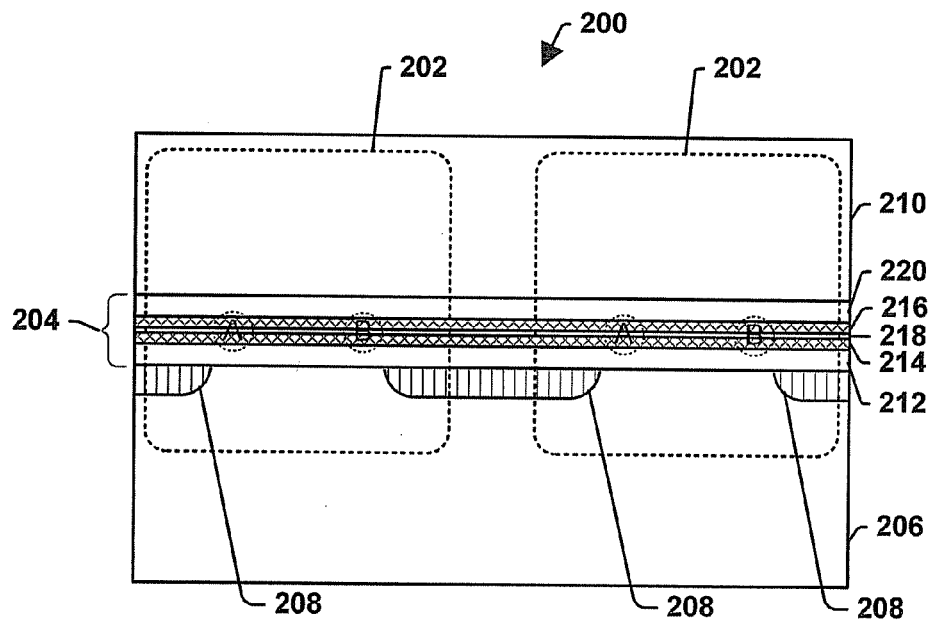
FIGS. 2-7 are cross-sectional views of exemplary memory devices containing memory cells in accordance with other aspects of the specification.

FIG. 2A illustrates a cross-sectional view of an exemplary memory device 200 containing memory cells 202 as indicated by a dashed line. The memory cell 202 can include a charge storage stack 204 over a semiconductor substrate 206 with bit lines 208 underlying the charge storage stack. The memory cell 202 can further include a semiconductor gate 210 over the charge storage stack 204.

The charge storage stack 204 can provide two or more locations (e.g., charge storage nodes) between the bit lines 208 for storage of electrical charges. By way of illustration, the memory device can store two spatially separated data bits, including a left bit represented by the dashed circle A and a right bit represented by the dashed circle B. The semiconductor substrate 206 and the semiconductor gate 210 provide access for reading and erasing storage locations of the electrical charges.

The memory device 200 can be designed to provide designated operations, such as programming, reading, and erasing as well as deriving necessary voltages to effect such operations. To effect the designated operations, predetermined voltages can be connected to the memory cell 202 through the bit lines (e.g., a source and a drain) 208 and the semiconductor gate 210. The memory cell 202 can not interfere with other adjacent instances of the memory cell because each instance of the memory cell can be programmed one at a time and only one instance of the memory cell is active during programming.

The semiconductor substrate 206 can contain any suitable semiconductor material on which electric devices such as memory cell transistors can be formed. Examples of semiconductor materials include silicon, gallium arsenide, indium phosphide, and the like. The semiconductor gate 210 typically contains polysilicon. The semiconductor substrate 206 can be a p-doped layer and the semiconductor gate 210 can be an n-doped layer.

The charge storage stack 204 can include multiple layers. The charge storage stack 204 can contain a first insulating layer 212, two charge storage layers 214, 216 on the first insulating layer 212, a first dielectric layer 218 between the two charge storage layers 214, 216, and a second insulating layer 220 on the charge storage layers. Although a charge storage stack can contain two or more charge storage layers as will be described in detail below, by way of illustration, the charge storage stack 204 in this example has two charge storage layers.

The first insulating layer 212 may be referred to as a bottom dielectric layer or a tunneling dielectric layer. The second insulating layer 220 may be referred to as a top dielectric layer. The charge storage layer 214, 216 can provide two or more charge-storing locations for storing the electrons in a single instance of the memory cell. The first insulating layer 212, the first dielectric layer 218 between the charge storage layers 214, 216, and/or the second insulating layer 220 can provide containment of the electrons.

The first insulating layer 212 and/or the second insulating layer 220 can contain a dielectric oxide, such as silicon dioxide silicon oxide (e.g., $SiO_2$), other standard-K material (e.g., having a relative permittivity below about ten), or a high-K material (e.g., having a relative permittivity, in one embodiment, above about ten and, in another embodiment, above about twenty).

The first insulating layer 212 and/or the second insulating layer 220 can have any suitable thickness that depends on, for example, the desired implementations, and/or the memory device being fabricated. In one embodiment, the first insulating layer 212 and/or the second insulating layer 220 has a thickness of about 10 Angstroms or more and about 500 Angstroms or less, independently. In another embodiment, the first insulating layer 212 and/or the second insulating layer 220 has a thickness of about 20 Angstroms or more and about 300 Angstroms or less, independently. In yet another embodiment, the first insulating layer 212 and/or the second insulating layer 220 has a thickness of about 30 Angstroms or more and about 100 Angstroms or less, independently.

The charge storage layers 214, 216 can contain silicon-rich silicon nitride (SRN or SiRN). Silicon-rich silicon nitride is a type of silicon nitride that has 1) a greater number of silicon atoms than the number of silicon atoms in stoichiometric silicon nitride, or 2) a lesser number of nitrogen atoms than the number of nitrogen atoms in stoichiometric silicon nitride. Stoichiometric silicon nitride has the chemical formula $Si_xN_y$ where x=3 and y=4. While silicon-rich silicon nitride also has the chemical formula $Si_xN_y$, it has a composition where the ratio of x/y is greater than 3/4. In one embodiment, silicon rich silicon nitride has the chemical formula $Si_xN_y$ wherein x is greater than 3 and less than about 8 and y is 4. In another embodiment, silicon rich silicon nitride has the chemical formula $Si_xN_y$ wherein x is greater than 3 and less than about 7 and y is about 4. In yet another embodiment, silicon rich silicon nitride has the chemical formula $Si_xN_y$ wherein x is greater than 3 and less than about 6 and y is about 4. In still yet another embodiment, silicon rich silicon nitride has the chemical formula $Si_xN_y$ wherein x is greater than 3 and less than about 5 and y is about 4. Silicon-rich silicon nitride can have desirable conductive properties compared to the stoichiometric silicon nitride. For example, the silicon-rich nitride improves the erase function, such as Fowler-Nordheim tunneling, for erasing the locations with the electrical charges by an approximately three or more orders of magnitude over nitride alone.

Layers of the charge storage stack 204 can have any suitable k-value (i.e., refractive index) for storing electrons. The k-value is an extinction coefficient, determined by an optical indirect measurement of phase and intensity change. The k-value can be measured at a wavelength of 248 nm using spectroscopic ellipsometer VUV-VASE® manufactured by J. A. Woollam Co., Inc. In one embodiment, a charge storage layer has a higher k-value than a first insulating layer 212, a second insulating layer 220, and/or a dielectric layer between charge storage layers.

Charge storage layers can have a higher k-value than a dielectric layer between charge storage layers. In one embodiment, when a charge storage layer contains silicon-rich silicon nitride and a dielectric layer between charge storage layers contains substantially stoichiometric silicon nitride, the charge storage layer has a k-value higher than zero and the dielectric layer has a k-value of about zero. In another embodiment, the charge storage layers have a k-value of about 0.1 or more and about 2 or less, and the dielectric layer has a k-value of about zero.

The charge storage layers 214, 216 can have any suitable k-value for storing electrons. In one embodiment, charge storage layers have the about same k-value each other. A first charge storage layer 214 has the about same k-value as a second charge storage layer 216. In another embodiment, charge storage layers 214, 216 have different k-values from each other. A first charge storage layer 214 can have a higher k-value than a second charge storage layer 216. In one embodiment, a first charge storage layer 214 has a higher k-value than a second charge storage layer 216 by about 0.05 or more and about 0.7 or less. In another embodiment, a first charge storage layer 214 has a higher k-value than a second charge storage layer 216 by about 0.07 or more and about 0.6 or less. In yet another embodiment, a first charge storage layer 214 has a higher k-value than a second charge storage layer 216 by about 0.1 or more and about 0.5 or less.

In one embodiment, a first charge storage layer has a k-value of about 0.4 or more and about 2 or less, and a second charge storage layer has a k-value of about 0.1 or more and about 1.7 or less. In another embodiment, a first charge storage layer has a k-value of about 0.7 or more and about 1.8 or less, and a second charge storage layer has a k-value of about 0.2 or more and about 1.5 or less. In yet another embodiment, a first charge storage layer has a k-value of about 1 or more and about 1.6 or less, and a second charge storage layer has a k-value of about 0.3 or more and about 1.2 or less.

When the charge storage layers 214, 216 contain silicon-rich silicon nitride, the charge storage layers can have any suitable silicon richness (e.g., silicon content) for storing electrons. Silicon richness means a weight percentage of silicon of a silicon-rich silicon nitride based on a weight of the silicon-rich silicon nitride. As silicon richness of a silicon nitride increases, a k-value of the silicon nitride increases. In one embodiment, the charge storage layers 214, 216 have the about same silicon richness each other.

In another embodiment, the charge storage layers 214, 216 have different silicon richness from each other. A first charge storage layer can have higher silicon richness than a second charge storage layer. In one embodiment, a first charge storage layer 214 has higher silicon richness than a second charge storage layer 216 by about 1 wt. % or more and about 5 wt. % or less. In another embodiment, a first charge storage layer has higher silicon richness than a second charge storage layer by about 0.7 wt. % or more and about 4 wt. % or less. In yet another embodiment, a first charge storage layer has higher silicon richness than a second charge storage layer by about 0.5 wt. % or more and about 3 wt. % or less.

In one embodiment, when the charge storage layers 214, 216 contain silicon-rich silicon nitride, a first charge storage layer has about 67 wt. % of silicon or more and about 83 wt. % of silicon or less, and a second charge storage layer has about 60 wt. % of silicon or more and about 73 wt. % of silicon or less. In another embodiment, a first charge storage layer has about 69 wt. % of silicon or more and about 83 wt. % of silicon or less, and a second charge storage layer has about 60 wt. % of silicon or more and about 71 wt. % of silicon or less. In yet another embodiment, a first charge storage layer has about 71 wt. % of silicon or more and about 80 wt. % of silicon or less, and a second charge storage layer has about 60 wt. % of silicon or more and about 69 wt. % of silicon or less.

The charge storage layers 214, 216 can have any suitable thickness that depends on, for example, the desired implementations, and/or the memory device being fabricated. In one embodiment, each charge storage layer has a thickness of about 1 Angstroms or more and about 100 Angstroms or less, independently. In another embodiment, each charge storage layer has a thickness of about 3 Angstroms or more and about 50 Angstroms or less, independently. In yet another embodiment, each charge storage layer has a thickness of about 3 Angstroms or more and about 50 Angstroms or less, independently.

The dielectric layer 218 between the charge storage layers 214, 216 can contain any suitable dielectric material for storing electrons in the charge storage stack 204. For example, the dielectric layer contains silicon nitride. In one embodiment, the dielectric layer contains substantially stoichiometric silicon nitride. When the charge storage layer and the dielectric layer between the charge storage layers contain silicon nitride, the silicon nitride of the charge storage layer has a ratio of silicon to nitrogen higher than the stoichiometric ratio of 3/4, and the dielectric layer has a ratio of silicon to nitrogen of the about stoichiometric ratio of 3/4.

The dielectric layer 218 can have any suitable k-value for storing electrons. In one embodiment, the dielectric layer has a lower k-value than charge storage layers. In another embodiment, the dielectric layer has a lower k-value than the second charge storage layer. The dielectric layers can have a k-value of about zero.

The dielectric layer 218 can have any suitable thickness that depends on, for example, the desired implementations, and/or the memory device being fabricated. In one embodiment, the dielectric layer has a thickness of about 0.5 Angstroms or more and about 30 Angstroms or less. In another embodiment, the dielectric layer has a thickness of about 1 Angstroms or more and about 20 Angstroms or less. In yet another embodiment, the dielectric layer has a thickness of about 2 Angstroms or more and about 10 Angstroms or less.

Figure 3A:
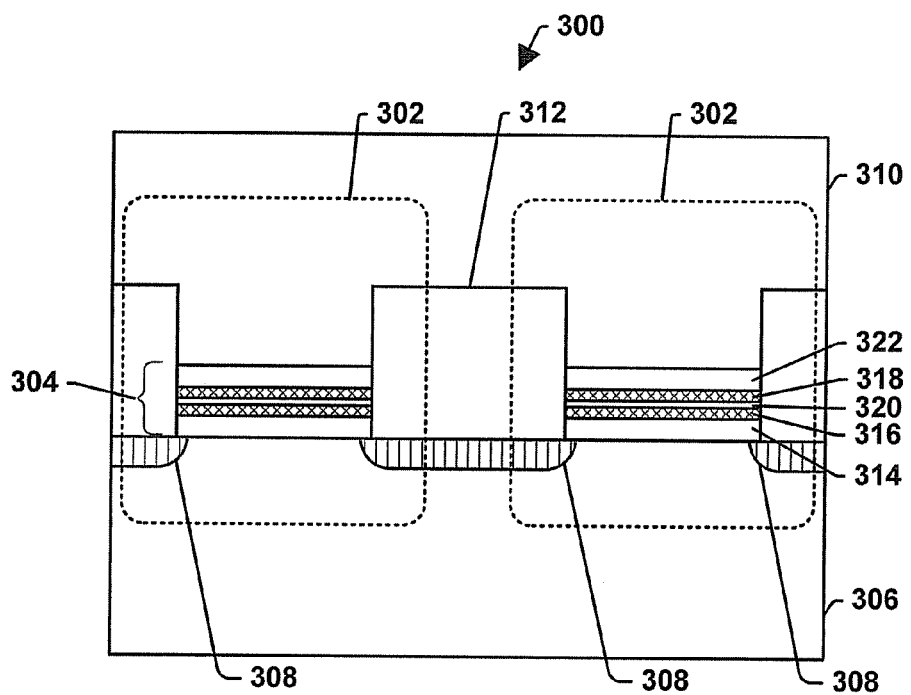

FIG. 3A illustrates a cross-sectional view of another exemplary memory device 300 containing memory cells 302 as indicated by a dashed line. The memory cell 302 can include a charge storage stack 304 over a semiconductor substrate 306 with bit lines 308 underlying the charge storage stack. The memory cell 302 can further include a semiconductor gate 310 over the charge storage stack 202. The memory device 300 includes the charge storage stack 304 in the similar manner as described in connection with FIG. 2A, except the memory device 300 includes bit line dielectrics 312 between the memory cells 302.

The charge storage stack 304 can include multiple layers in the similar manner as described in connection with FIG. 2A. The charge storage stack 304 can contain a first insulating layer 314, two charge storage layers 316, 318 on the first insulating layer 314, a first dielectric layer 320 between the charge storage layers 316, 318, and a second insulating layer 322 on the charge storage layers.

The bit line dielectric can contain any suitable dielectric material such as oxides. Examples of oxides include silicon oxide, tetraethylorthosilicate (TEOS) oxide, high aspect ratio plasma (HARP) oxide, high temperature oxide (HTO), high density plasma (HDP) oxide, or the like.

The bit line dielectric 312 can have any suitable height that depends on, for example, the desired implementations and/or the semiconductor structure 300 being fabricated. The upper surface of the bit line dielectric 312 can be higher than the upper surface of the charge storage stack 304. In one embodiment, the upper surface of the bit line dielectric is higher than the upper surface of the charge storage stack by about 5 nm or more and about 30 nm or less. In another embodiment, the upper surface of the bit line dielectric is higher than the upper surface of the charge storage stack by about 10 nm or more and about 20 nm or less.

Figure 4:
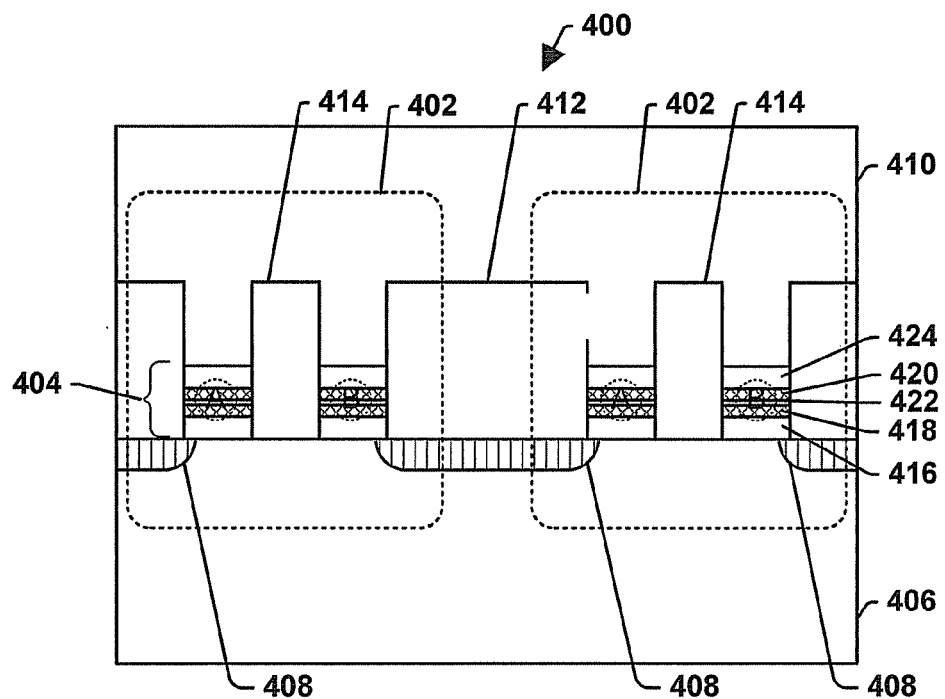

FIG. 4 illustrates a cross-sectional view of another exemplary memory device 400 containing cells 402 as indicated by a dashed line. The memory cell 402 can include a charge storage stack 404 over a semiconductor substrate 406 with bit lines 408 underlying the charge storage stack. The memory cell 402 can further include a semiconductor gate 410 over the charge storage stack 404 and bit line dielectrics 412 between the memory cells 402. The memory device 400 includes the charge storage stack 404 in the similar manner as described in connection with FIG. 3A, except the memory cell 402 includes center dielectrics 414 in the charge storage stack.

The memory device 400 can store two spatially separated data bits, including a left bit represented by the dashed circle A and a right bit represented by the dashed circle B. In this embodiment, the two charge storage nodes are physically separated by the central dielectric 414. The central dielectric 414 can prevent and/or mitigate undesirable signal crossover (e.g., crosstalk) between the two separated charge storage nodes. As a result, the resultant memory device 400 can provide exceptional read and write performance.

The charge storage stack 404 can include multiple layers in the similar manner as described in connection with FIG. 2A. The charge storage stack 404 can contain a first insulating layer 416, two charge storage layers 418, 420 on the first insulating layer 416, a first dielectric layer 422 between the charge storage layers, and a second insulating layer 424 on the charge storage layers.

The center dielectric 414 can contain any suitable dielectric material such as oxides. Examples of oxides include silicon oxide, tetraethylorthosilicate (TEOS) oxide, high aspect ratio plasma (HARP) oxide, high temperature oxide (HTO), high density plasma (HDP) oxide, or the like.

The center dielectric 414 can have any suitable height that depends on, for example, the desired implementations and/or the semiconductor structure 400 being fabricated. The upper surface of the center dielectric 414 can be higher than the upper surface of the charge storage stack 404. In one embodiment, the upper surface of the center dielectric is higher than the upper surface of the charge storage stack by about 5 nm or more and about 30 nm or less. In another embodiment, the upper surface of the center dielectric is higher than the upper surface of the charge storage stack by about 10 nm or more and about 20 nm or less.

Figure 5:
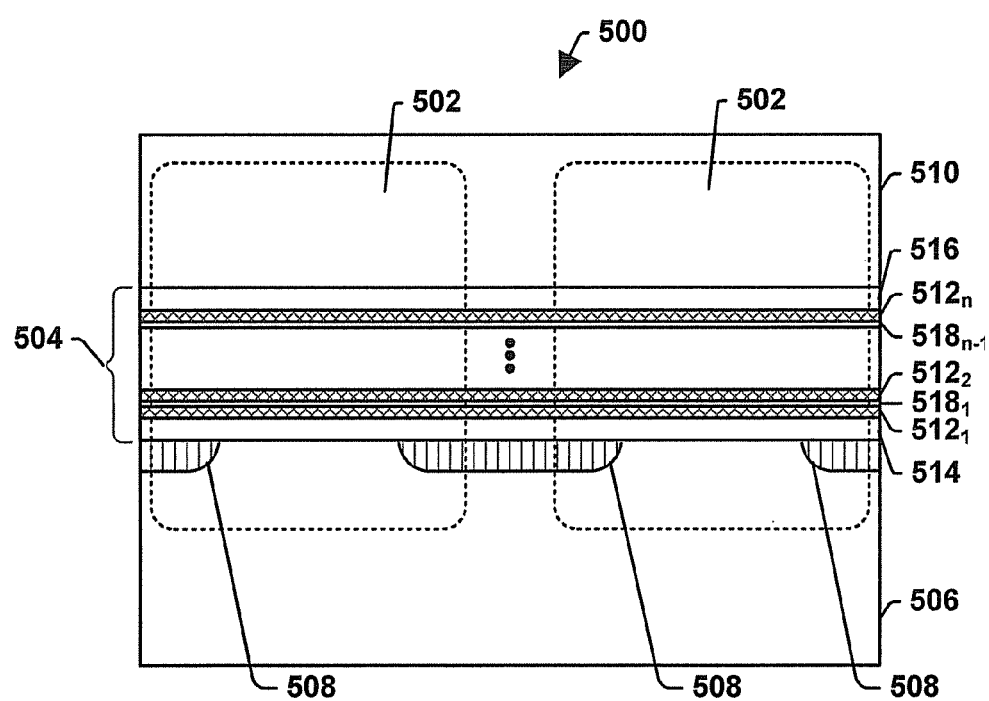

FIG. 5 illustrates a cross-sectional view of another exemplary memory device 500 containing memory cells 502 as indicated by a dashed line. The memory cell 502 can include a charge storage stack 504 over a semiconductor substrate 506 with bit lines 508 underlying the charge storage stack. The memory cell 502 can further include a semiconductor gate 510 over the charge storage stack 504.

The charge storage stack 504 can include multiple layers in the similar manner as described in connection with FIG. 2A, except the charge storage stack includes three or more charge storage layers $512_1, 512_2, \ldots 512_n$, between a first insulating layer 514 and a second insulating layer 516, and two or more dielectric layers $518_1, 518_{n-1}$ between each of the charge storage layers. Numbers of the charge storage layers increase from the bottom to the top. In one embodiment, the charge storage stack 504 include 3 or more charge storage layers and about 12 or less charge storage layers, and dielectric layers between each of the charge storage layers. In another embodiment, the charge storage stack 504 include 3 or more charge storage layers and about 10 or less charge storage layers, and dielectric layers between each of the charge storage layers. In one embodiment, the charge storage stack 504 include 3 or more charge storage layers and about 8 or less charge storage layers, and dielectric layers between each of the charge storage layers.

In one embodiment, the charge storage stack 504 can contain a first insulating layer, three charge storage layers on the first insulating layer, two dielectric layers between each of the three charge storage layers, and a second insulating layer on the charge storage layers. In another embodiment, the charge storage stack 504 can contain a first insulating layer, four charge storage layers on the first insulating layer, three dielectric layers between each of the four charge storage layers, and a second insulating layer on the charge storage layers. In yet another embodiment, the charge storage stack 504 can contain a first insulating layer, five charge storage layers on the first insulating layer, four dielectric layers between each of the four charge storage layers, and a second insulating layer on the charge storage layers.

The first insulating layer may be referred to as a bottom dielectric layer or a tunneling dielectric layer. The second insulating layer may be referred to as a top dielectric layer. The charge storage layer 512 can provide two or more charge-storing locations for storing the electrons in a single instance of the memory cell. The first insulating layer 514, the dielectric layers 518 between the charge storage layers, and/or the second insulating layer 516 can provide-containment of the electrons.

The charge storage layers 512 can have any suitable k-value for storing electrons. In one embodiment, the charge storage layers have the about same k-value each other. A lower-numbered charge storage layer (e.g., n−1th charge storage layer) has the about same k-value as the higher-numbered charge storage layer (e.g., nth charge storage layer). In another embodiment, the charge storage layers have different k-values from each other. A lower-numbered charge storage layer can have a higher k-value than a higher-numbered charge storage layer. In one embodiment, a lower-numbered charge storage layer has a higher k-value than a higher-numbered charge storage layer by about 0.05 or more and about 0.7 or less. In another embodiment, a lower-numbered charge storage layer has a higher k-value than a higher-numbered charge storage layer by about 0.07 or more and about 0.6 or less. In yet another embodiment, a lower-numbered charge storage layer has a higher k-value than a higher-numbered charge storage layer by about 0.1 or more and about 0.5 or less.

In one embodiment, when the charge storage stack 504 contain three charge storage layers, a first charge storage layer has a k-value of about 0.8 or more and about 2 or less, a second charge storage layer has a k-value of about 0.4 or more and about 1.7 or less, and a third charge storage layer has a k-value of about 0.1 or more and about 1.3 or less. In another embodiment, a first charge storage layer has a k-value of about 1 or more and about 1.8 or less, a second charge storage layer has a k-value of about 0.6 or more and about 1.5 or less, and a third charge storage layer has a k-value of about 0.3 or more and about 1.8 or less.

In one embodiment, when the charge storage stack 504 contain four charge storage layers, a first charge storage layer has a k-value of about 1 or more and about 2 or less, a second charge storage layer has a k-value of about 0.7 or more and about 1.7 or less, a third charge storage layer has a k-value of about 0.5 or more and about 1.4 or less, and a fourth charge storage layer has a k-value of about 0.1 or more and about 1.1 or less. In another embodiment, a first charge storage layer has a k-value of about 1.2 or more and about 1.8 or less, a second charge storage layer has a k-value of about 0.9 or more and about 1.5 or less, a third charge storage layer has a k-value of about 0.7 or more and about 1.2 or less, and a fourth charge storage layer has a k-value of about 0.3 or more and about 0.9 or less.

When the charge storage layers 512 contain silicon-rich silicon nitride, the charge storage layers can have any suitable silicon richness (e.g., silicon content) for storing electrons. In one embodiment, the charge storage layers have the about same silicon richness each other. A lower-numbered charge storage layer (e.g., n–1th charge storage layer) has the about same silicon richness as a higher-numbered charge storage layer (e.g., nth charge storage layer). In another embodiment, the charge storage layers have different silicon richness from each other. A lower-numbered charge storage layer can have higher silicon richness than a higher-numbered charge storage layer. In one embodiment, a lower-numbered charge storage layer has higher silicon richness than a higher-numbered charge storage layer by about 1 wt. % or more and about 5 wt. % or less. In another embodiment, a lower-numbered charge storage layer has higher silicon richness than a higher-numbered charge storage layer by about 0.7 wt. % or more and about 4 wt. % or less. In yet another embodiment, a lower-numbered charge storage layer has higher silicon richness than a higher-numbered charge storage layer by about 0.5 wt. % or more and about 3 wt. % or less.

In one embodiment, when the charge storage stack includes three charge storage layers containing silicon-rich silicon nitride, a first charge storage layer has about 70 wt. % of silicon or more and about 83 wt. % of silicon or less, a second charge storage layer has about 65 wt. % of silicon or more and about 80 wt. % of silicon or less, and a third charge storage layer has about 60 wt. % of silicon or more and about 70 wt. % of silicon or less. In another embodiment, a first charge storage layer has about 73 wt. % of silicon or more and about 80 wt. % of silicon or less, a second charge storage layer has about 68 wt. % of silicon or more and about 77 wt. % of silicon or less, and a third charge storage layer has about 63 wt. % of silicon or more and about 73 wt. % of silicon or less.

In one embodiment, when the charge storage stack includes four charge storage layers containing silicon-rich silicon nitride, a first charge storage layer has about 72 wt. % of silicon or more and about 83 wt. % of silicon or less, a second charge storage layer has about 67 wt. % of silicon or more and about 78 wt. % of silicon or less, a third charge storage layer has about 62 wt. % of silicon or more and about 73 wt. % of silicon or less, and a fourth charge storage layer has about 60 wt. % of silicon or more and about 68 wt. % of silicon or less. In another embodiment, a first charge storage layer has about 75 wt. % of silicon or more and about 80 wt. % of silicon or less, a second charge storage layer has about 70 wt. % of silicon or more and about 75 wt. % of silicon or less, a third charge storage layer has about 65 wt. % of silicon or more and about 70 wt. % of silicon or less, and a fourth charge storage layer has about 60 wt. % of silicon or more and about 65 wt. % of silicon or less.

The dielectric layers 518 can have any suitable k-value for storing electrons. In one embodiment, the dielectric layers have lower k-values than charge storage layers. In another embodiment, the dielectric layers have a lower k-value than the highest-numbered charge storage layer. The dielectric layers can have a k-value of about 0.

Figure 6:
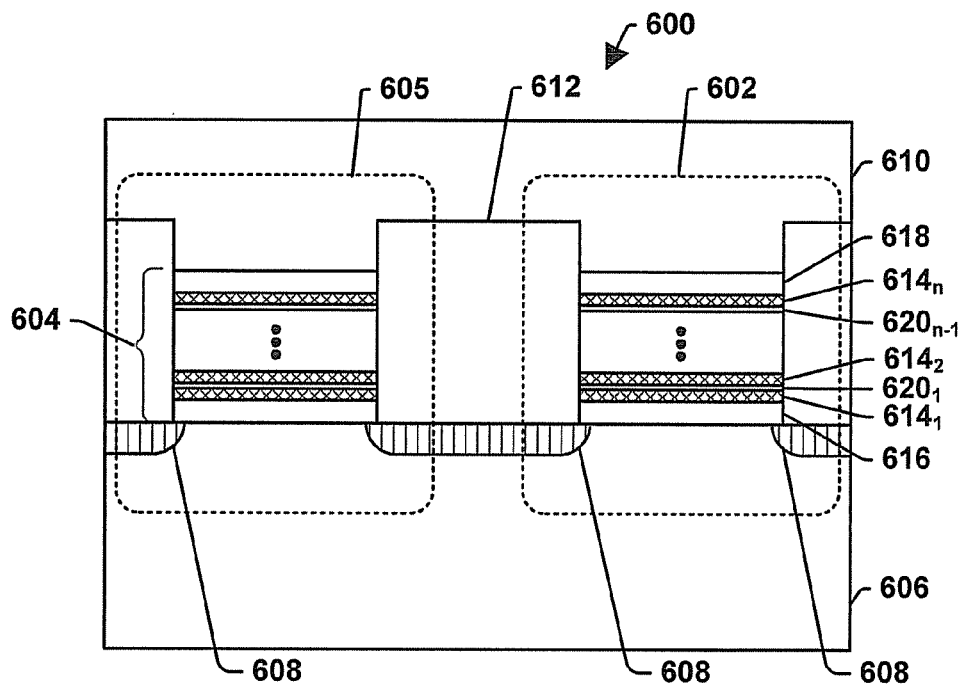

FIG. 6 illustrates a cross-sectional view of another exemplary memory device 600 containing memory cells 602 as indicated by a dashed line. The memory cell 602 can include a charge storage stack 604 over a semiconductor substrate 606 with bit lines 608 underlying the charge storage stack. The memory cell 602 can further include a semiconductor gate 610 over the charge storage stack 604. The memory device 600 includes the charge storage stack 604 in the similar manner as described in connection with FIG. 5, except the memory device 600 includes bit line dielectrics 612 between the memory cells 602 in the similar manner as describe in connection with FIG. 3A.

The charge storage stack 604 can include multiple layers in the similar manner as described in connection with FIG. 5. The charge storage stack 604 can include three or more charge storage layers $614_1$, $614_2$, ... $614_n$ between a first insulating layer 616 and a second insulating layer 618, and two or more dielectric layers $620_1$, ... $620_{n-1}$ between each of the charge storage layers.

Figure 7:
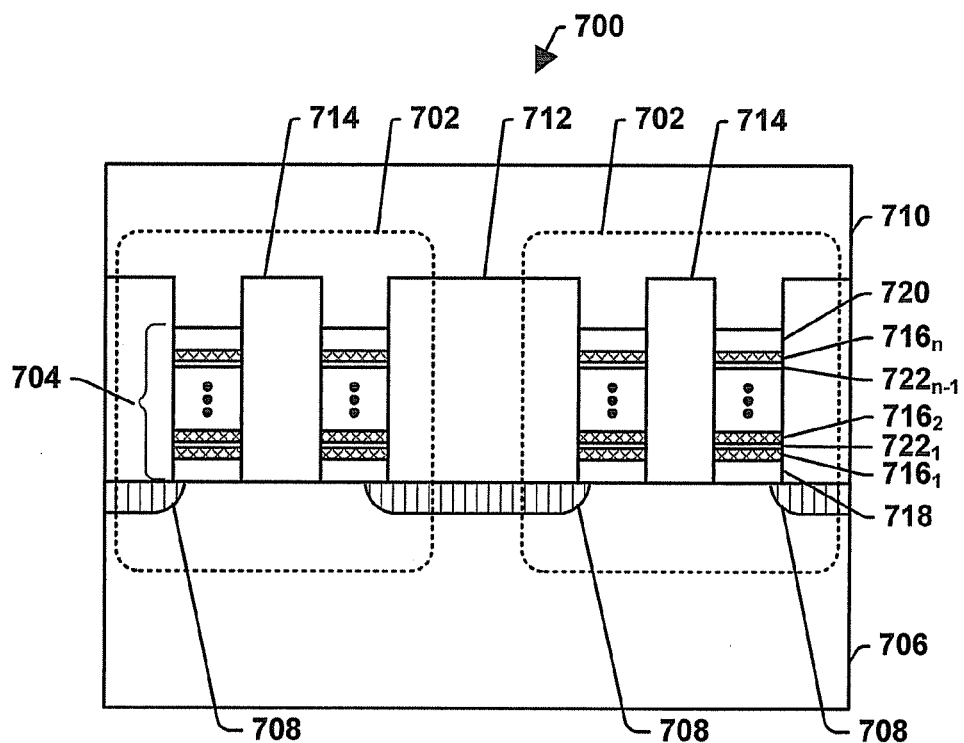

FIG. 7 illustrates a cross-sectional view of another exemplary memory device 700 containing memory cells 702 as indicated by a dashed line. The memory cell 702 can include a charge storage stack 704 over a semiconductor substrate 706 with bit lines 708 underlying the charge storage stack. The memory cell 702 can further include a semiconductor gate 710 over the charge storage stack 704 and bit line dielectrics 712 between memory cells 702. The memory device 700 includes the charge storage stack 704 in the similar manner as described in connection with FIG. 6, except the memory cells 702 include center dielectrics 714 in the charge storage stack in the similar manner as described in connection with FIG. 4.

The charge storage stack 702 can include multiple layers in the similar manner as described in connection with FIG. 6. The charge storage stack 704 can include three or more charge storage layers $716_1$, $716_2$, ... $716_n$ between a first insulating layer 718 and a second insulating layer 720, and two or more dielectric layers $722_1$, ... $722_{n-1}$ between each of the charge storage layers.

Figure 8:
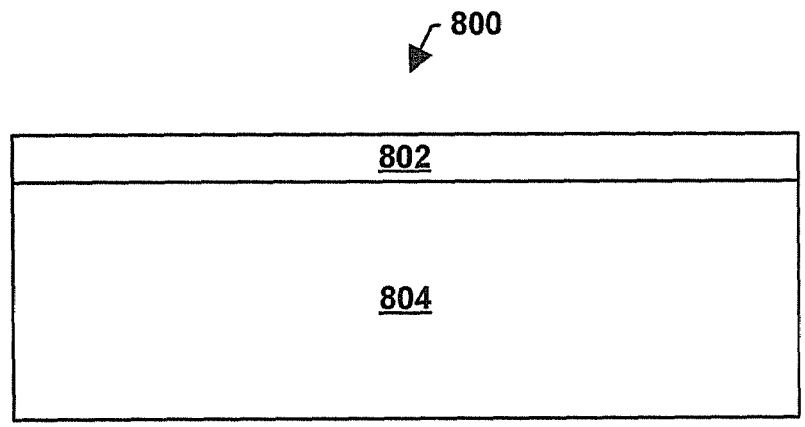
FIGS. 8-12 illustrate exemplary methods of forming charge storage stacks in accordance with other aspects of the specification.

Referring to FIGS. 8-11 and 12, two of many possible exemplary embodiments of forming a charge storage stack are specifically illustrated. FIG. 8 illustrates a cross sectional view of an intermediate state of a portion of an exemplary memory device 800. The memory device 800 can contain a first insulating layer 802 over a semiconductor substrate 804.

When the first insulating layer 802 contains an oxide material, the first insulating layer can be formed by oxidation techniques (e.g., thermal oxidation, plasma-assisted oxidation, and the like) and/or deposition techniques (e.g., chemical vapor deposition (CVD), spin-on techniques, and the like). In one embodiment, the first insulating layer 802 is a thermally grown layer of silicon dioxide or is deposited by CVD. Examples of CVD include low pressure chemical vapor deposition (LPCVD) from either a tetraethylorthosilicate (TEOS) or $SiH_4$ (silane) source and plasma enhanced CVD. When thermally grown, the first insulating layer 802 can be grown thermally from silicon, silicon nitride, or silicon-rich silicon nitride.

In one embodiment, the first insulating layer 802 containing a silicon oxide is formed by either thermal oxidation or by plasma enhanced chemical vapor deposition (PECVD) using an RF power of about 100 W to about 700 W and a temperature of about 300 degrees Celsius to about 500 degrees Celsius. The first insulating layer 802 can be formed by reacting a silicon precursor (e.g., silane ($SiH_4$), disilane ($Si_2H_6$), dichlorosilane ($SiCl_2H_2$), hexachlorodisilane ($Si_2Cl_6$)) and an oxygen precursor (e.g., oxygen ($O_2$), nitrous oxide ($N_2O$)) in a nitrogen carrier gas.

Figure 9:
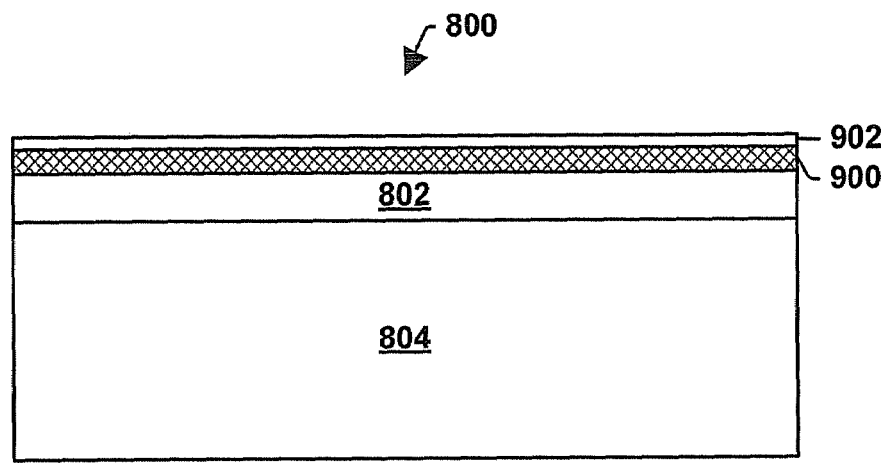

FIG. 9 illustrates forming a first charge storage layer 900 on the first insulating layer 802 and a first dielectric layer 902 on the first charge storage layer 900. The first charge storage layer 900 can contain any of the materials of the first charge storage layer 214 as described above in connection with FIG.

2A. In one embodiment, the first charge storage layer 900 can contain a silicon-rich silicon nitride ($Si_xN_y$). The silicon-rich silicon nitride has a ratio of silicon (Si) to nitrogen (N) greater than 0.75, i.e., ratio of x/y greater than 3/4.

When a charge storage layer contains a silicon-rich silicon nitride, it can be formed by suitable deposition technique including CVD, cyclical CVD, LPCVD, PECVD, thermal chemical vapor deposition (RTCVD), atomic layer deposition (ALD), spin-on techniques, or the like.

A k-value and/or silicon richness (e.g., silicon content) of a charge storage layer can be controlled by any suitable technique. A k-value and/or silicon richness can be controlled during deposition by varying a gaseous concentration ratio of a nitrogen precursor to a silicon precursor in a deposition reactor, a soak time of a nitrogen precursor and/or a silicon precursor, a cycle number of the deposition process, or the like. In one embodiment, a gaseous concentration ratio of a nitrogen precursor to a silicon precursor is about 1:1 or more and about 1:100 or less. In another embodiment, a gaseous concentration ratio of a nitrogen precursor to a silicon precursor is about 1:1 or more and about 1:60 or less. In yet another embodiment, a gaseous concentration ratio of a nitrogen precursor to a silicon precursor is about 1:1 or more and about 1:40 or less.

The gaseous concentration ratio of a nitrogen precursor to a silicon precursor can be controlled by varying a flow rate ratio of the nitrogen precursor to the silicon precursor into a deposition reactor. In one embodiment, a nitrogen precursor is introduced a deposition chamber at a flow rate of about 1 sccm or more and about 50 sccm ore less, and a silicon precursor is introduced at a flow rate of about 10 sccm or more and about 400 sccm or less. In another embodiment, a nitrogen precursor is introduced a deposition chamber at a flow rate of about 2 sccm or more and about 40 sccm ore less, and a silicon precursor is introduced at a flow rate of about 20 sccm or more and about 350 sccm or less. In yet another embodiment, a nitrogen precursor is introduced a deposition chamber at a flow rate of about 5 sccm or more and about 30 sccm ore less, and a silicon precursor is introduced at a flow rate of about 30 sccm or more and about 300 sccm or less.

When a cyclical CVD process is employed for forming a charge storage layer, the cyclical CVD process can involve process cycles involving providing a silicon precursor, purging the remaining silicon precursor, providing a nitrogen precursor, and purging the remaining nitrogen precursor. A k-value and/or silicon richness (e.g., silicon content) of a charge storage layer can be controlled by varying times for providing the silicon precursor and/or for providing the nitrogen precursor (e.g., longer time for providing a silicon precursor than for providing a nitrogen precursor). In one embodiment, a ratio of time for providing a nitrogen precursor to time for providing a silicon precursor in a cycle is about 1:1 or more and about 1:100 or less. In another embodiment, a ratio of time for providing a nitrogen precursor to time for providing a silicon precursor in a cycle is about 1:1 or more and about 1:60 or less. In yet another embodiment, a ratio of time for providing a nitrogen precursor to time for providing a silicon precursor in a cycle is about 1:1 or more and about 1:40 or less.

Alternatively or additionally, the k-value and/or silicon richness (e.g., silicon content) of a charge storage layer can be controlled by varying the flow rate of the silicon precursor and/or the nitrogen precursor. Generally speaking, the larger the flow rate of the silicon precursor and/or the smaller the flow rate of the nitrogen precursor results in a higher silicon richness in the resultant charge storage layer.

The deposition process can be carried out for a period of time and at gas flow rates sufficient to form a silicon-rich silicon nitride layer having a suitable thickness. The thickness of a charge storage layer can be controlled by a cycle number of the process. In one embodiment, the charge storage layer is formed by performing several hundreds of cycles.

A first dielectric layer 902 is formed on the first charge storage layer 900. A dielectric layer can contain any of the materials of the dielectric layer 218 as described above in connection with FIG. 2A. A dielectric layer can contain any suitable dielectric material such as silicon nitride (e.g., substantially stoichiometric silicon nitride). The dielectric layer can be formed by any suitable technique. In one embodiment, a dielectric layer containing stoichiometric silicon nitride is formed in the similar manner as described for forming the first charge storage layer 900, except deposition conditions (e.g., a gaseous concentration ratio of a nitrogen precursor and a silicon precursor, or the like) are controlled to form a substantially stoichiometric silicon nitride.

Figure 10:
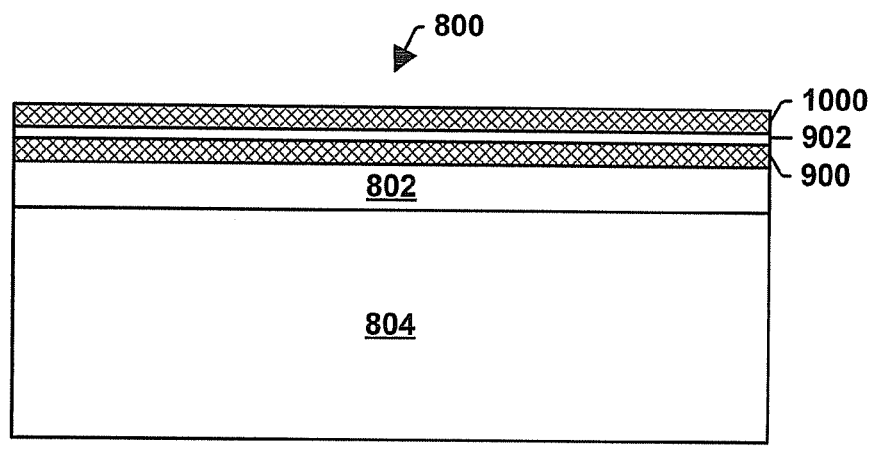

FIG. 10 illustrates forming a second charge storage layer 1000 over the first dielectric layer 902. The second charge storage layer 1000 can contain any of the materials of the charge storage layer 216 as described above in connection with FIG. 2A. The second charge storage layer 1000 can be formed by any of the techniques that are used for the first charge storage layer 900 as described above in connection with FIG. 9.

In one embodiment, the first charge storage layer 900 has a higher k-value than the second charge storage layer 1000. In another embodiment, the first charge storage layer 900 contains higher silicon richness than the second charge storage layer 1000. The higher k-value and/or the higher silicon richness can be achieved during deposition by varying a gaseous concentration ratio of a silicon precursor to a nitrogen precursor in a deposition reactor, a flow rate ratio of a silicon precursor to a nitrogen precursor into a deposition reactor, or the like. In one embodiment, a gaseous concentration ratio of a silicon precursor to a nitrogen precursor and/or a flow rate ratio of a silicon precursor to a nitrogen precursor into a deposition reactor for forming a first charge storage layer are higher than those of a second charge storage layer. When a cyclical CVD process is employed for forming charge storage layers, a ratio of time for providing a silicon precursor to time for providing a nitrogen precursor in a cycle for forming a first charge storage layer is higher than one for forming a second charge storage layer.

Figure 11:
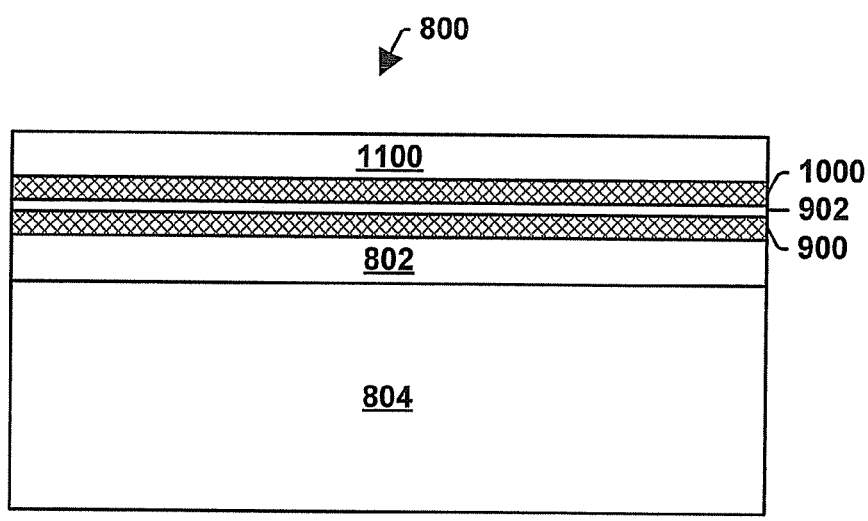

FIG. 11 illustrates forming a second insulating layer 1100 over the second charge storage layer 1000. The second insulating layer 11000 can contain any of the materials of the first insulating layer 220 as described above in connection with FIG. 2A. The second insulating layer 1100 can be formed by any of the techniques that are used for the first insulating layer 802 as described above in connection with FIG. 8.

Figure 12:
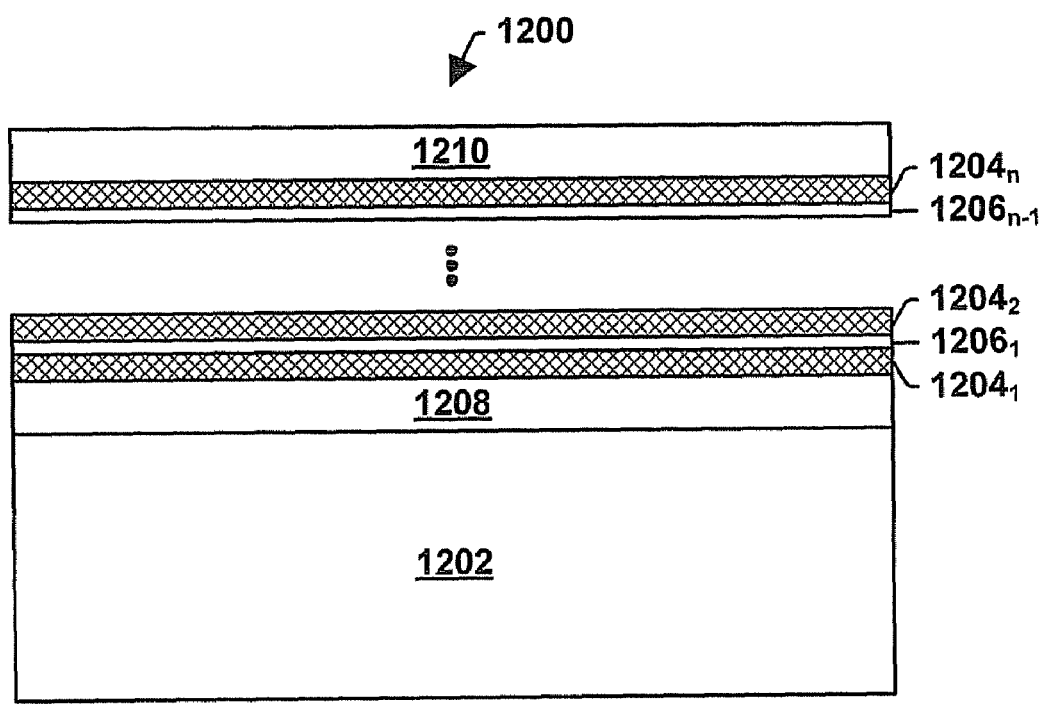

FIG. 12 illustrates another exemplary method of forming a charge storage stack 1200 on a semiconductor substrate 1202. The charge storage stack 1200 contains n charge storage layers $1204_1$, $1204_2$, . . . $1204_n$ and n−1 dielectric layers $1206_1$, . . . $1206_{n-1}$ between each of the charge storage layers. After a first insulating layer 1208 is formed on a semiconductor substrate 1202, a first charge storage layer $1204_1$ can be formed on the first insulating layer, and a first dielectric layer $1206_1$ can be formed on the first charge storage layer $1204_1$ in the similar manner as described in the connection with FIG. 9. Similarly, an n−1th dielectric layer can be formed on an n−1th charge storage layer, and an nth layer can be formed on an n−1th dielectric layer. In one embodiment, n is 2 or more and about 12 or less. In another embodiment, n is 2 or more and about 10 or less. In yet another embodiment, n is 2 or more and about 8 or less.

In one embodiment, an n−1th charge storage layer has a higher k-value than an nth charge storage layer. In another embodiment, an n−1th charge storage layer contains a higher silicon content than an nth charge storage layer. The higher k-value and/or the higher silicon content of the n−1th charge storage layer can be achieved during deposition by varying a gaseous concentration ratio of a nitrogen precursor to a silicon precursor in a deposition reactor, a flow rate ratio of a nitrogen precursor to a silicon precursor into a deposition reactor, or the like. In one embodiment, a gaseous concentration ratio of a silicon precursor to a nitrogen precursor and/or a flow rate ratio of a silicon precursor to a nitrogen precursor into a deposition reactor for forming an n−1th charge storage layer are higher than those of an nth charge storage layer. When a cyclical CVD process is employed for forming charge storage layers, a ratio of time for providing a silicon precursor to time for providing a nitrogen precursor in a cycle for forming an n−1th charge storage layer is higher than one for forming an nth charge storage layer.

After an nth charge storage layer $1204_n$ is formed, a second insulating layer 1210 can be formed on the nth charge storage layer $1204_n$ in the similar manner as described above in connection with FIG. 11.

Although not shown in FIGS. 8-12, a bit line dielectric can be formed between portions of a charge storage stack at any suitable time, as described in connection with FIGS. 3A and 6. In one embodiment, the bit line dielectric is formed after the charge storage stack is formed. The bit line dielectric can be formed by forming a charge storage stack, removing portions of the charge storage stack, and forming dielectric material at the portions. In another embodiment, bit line dielectrics are formed and then portions of charge storage stack are formed between the bit line dielectrics.

A center dielectric also can be formed between portions of a charge storage layer at any suitable time, as described in connection with FIGS. 4 and 7. In one embodiment, the center dielectric is formed after forming a charge storage stack. The center dielectric can be formed by forming a charge storage stack, removing portions of the charge storage stack, and forming dielectric material at the portions. In another embodiment, center dielectrics are formed and then portions of charge storage stack are formed between the center dielectrics.

A bit line dielectric and a center dielectric can be formed by any suitable technique. In one embodiment, the dielectric is formed by a HTO deposition process. For example, the HTO is formed by LPCVD using nitrous oxide ($N_2O$) and dichlorosilane ($SiH_2Cl_2$) gasses at a temperature of about 600 degrees Celsius or more and about 900 degrees Celsius or less and a pressure of about 100 mTorr or more and about 500 mTorr or less. In another embodiment, the dielectric is grown in plasma at low temperatures, e.g., plasma-grown oxide. For example, the dielectric contains plasma-grown oxide that is grown at a temperature of about 250 degrees Celsius or more and about 600 degrees Celsius or less. The dielectric may be formed by a HDP deposition process. The dielectric can be optionally subjected to an anneal in, for example, a nitrogen ambient at about 1000 degrees Celsius for thirty minutes.

Although not shown in FIGS. 8-12, the methodologies may include any suitable memory device fabrication processes. General examples of memory device fabrication processes include masking, patterning, etching, cleaning, planarization, thermal oxidation, implant, annealing, thermal treatment, and deposition techniques normally used for making memory devices.

The resultant memory stack, memory cell, and memory device formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant memory stack, memory cell, and memory device formed herein are useful in any electronic device. For example, the resultant memory stack, memory cell, and memory device are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the disclosed information. It is, of course, not possible to describe every conceivable combination of components or methodologies for purposes of describing the disclosed information, but one of ordinary skill in the art can recognize that many further combinations and permutations of the disclosed information are possible. Accordingly, the disclosed information is intended to embrace all such alterations, modifications and variations that fall within the spirit and scope of the appended claims. Furthermore, to the extent that the term "includes," "has," "involve," or variants thereof is used in either the detailed description or the claims, such term is intended to be inclusive in a manner similar to the term "comprising" as "comprising" is interpreted when employed as a transitional word in a claim.

What is claimed is:

1. A charge storage stack for a memory cell, comprising:
   a first insulating layer over a semiconductor substrate;
   n charge storage layers comprising silicon-rich silicon nitride over the first insulating layer, wherein numbers of the charge storage layers increase from the bottom to the top and a k-value of an n−1th charge storage layer is higher than a k-value of an nth charge storage layer;
   n−1 dielectric layers comprising substantially stoichiometric silicon nitride between each of the n charge storage layers; and
   a second insulating layer over the nth charge storage layers, wherein n is 2 or more and about 12 or less.

2. The charge storage stack of claim 1, wherein the silicon-rich silicon nitride comprises silicon nitride that has a greater number of silicon atoms than the number of silicon atoms in stoichiometric silicon nitride, or a lesser number of nitrogen atoms than the number of nitrogen atoms in stoichiometric silicon nitride.

3. The charge storage stack of claim 1, wherein an n−1th charge storage layer has a higher k-value than an nth charge storage layer by about 0.05 or more and about 0.7 or less.

4. The charge storage stack of claim 1, wherein the charge storage stack comprises two charge layers, and a first charge storage layer has a k-value of about 0.4 or more and about 2 or less and a second charge storage layer has a k-value of about 0.1 or more and about 1.7 or less.

5. The charge storage stack of claim 1, wherein the charge storage stack comprises three charge storage layers, and a first charge storage layer has a k-value of about 0.8 or more and about 2 or less, a second charge storage layer has a k-value of about 0.4 or more and about 1.7 or less, and a third charge storage layer has a k-value of about 0.1 or more and about 1.3 or less.

6. The charge storage stack of claim 1, wherein the charge storage stack comprises four charge storage layers, and a first charge storage layer has a k-value of about 1 or more and about 2 or less, a second charge storage layer has a k-value of about 0.7 or more and about 1.7 or less, a third charge storage layer has a k-value of about 0.5 or more and about 1.4 or less, and a fourth charge storage layer has a k-value of about 0.1 or more and about 1.1 or less.

7. The charge storage stack of claim 1, wherein n is 2 or more and about 10 or less.

8. A multiple level memory cell comprising the charge storage stack of claim 1.

9. A charge storage stack for a memory cell, comprising:
a first insulating layer over a semiconductor substrate;
n charge storage layers comprising silicon-rich silicon nitride over the first insulating layer, wherein numbers of the charge storage layers increase from the bottom to the top and silicon richness of an n−1th charge storage layer is higher than silicon richness of an nth charge storage layer;
n−1 dielectric layers comprising substantially stoichiometric silicon nitride between each of the n charge storage layers; and
a second insulating layer over the two or more charge storage layers.

10. The charge storage stack of claim 9, wherein the silicon-rich silicon nitride comprises silicon nitride that has a greater number of silicon atoms than the number of silicon atoms in stoichiometric silicon nitride, or a lesser number of nitrogen atoms than the number of nitrogen atoms in stoichiometric silicon nitride.

11. The charge storage stack of claim 9, wherein an n−1th charge storage layer has higher silicon richness than an nth charge storage layer by about 1 wt. % or more and about 5 wt. % or less.

12. The charge storage stack of claim 9, wherein the charge storage stack comprises two charge storage layers, and a first charge storage layer has about 67 wt. % of silicon or more and about 83 wt. % of silicon or less and a second charge storage layer has about 60 wt. % of silicon or more and about 73 wt. % of silicon or less.

13. The charge storage stack of claim 9, wherein the charge storage stack comprises three charge storage layers, and a first charge storage layer has about 70 wt. % of silicon or more and about 83 wt. % of silicon or less, a second charge storage layer has about 65 wt. % of silicon or more and about 80 wt. % of silicon or less, and a third charge storage layer has about 60 wt. % of silicon or more and about 70 wt. % of silicon or less.

14. The charge storage stack of claim 9, wherein the charge storage stack comprises four charge storage layers, and a first charge storage layer has about 72 wt. % of silicon or more and about 83 wt. % of silicon or less, a second charge storage layer has about 67 wt. % of silicon or more and about 78 wt. % of silicon or less, a third charge storage layer has about 62 wt. % of silicon or more and about 73 wt. % of silicon or less, and a fourth charge storage layer has about 60 wt. % of silicon or more and about 68 wt. % of silicon or less.

15. The charge storage stack of claim 9, wherein n is 2 or more and about 12 or less.

16. A multiple level memory cell comprising the charge storage stack of claim 9.

17. A method of forming a charge storage stack for a memory cell, comprising;
forming n charge storage layers over a first insulating layer over a substrate, wherein numbers of the charge storage layers increase from the bottom to the top and a k-value of an n−1th charge storage layer is higher than a k-value of an nth higher charge storage layer;
forming n−1 dielectric, layers between each of the n charge storage layers; and
forming a second insulating layer over the nth charge storage layer,
wherein n is 2 or more and about 12 or less.

18. The method of claim 17, wherein the charge storage layers are formed by deposition and k-values of the charge storage layers are controlled during deposition by varying a gaseous concentration ratio of a silicon precursor to a nitrogen precursor, a flow rate ratio of a silicon precursor to a nitrogen precursor, a ratio of time for providing a silicon precursor to time for providing a nitrogen precursor, or a combination of thereof.

19. The method of claim 17, wherein the charge storage layers are formed by cyclical chemical vapor deposition process.

20. The method of claim 19, wherein thicknesses of the charge storage layers are controlled by a cycle number of the cyclical chemical vapor deposition process.

* * * * *